United States Patent
Rohr et al.

(10) Patent No.: US 10,787,572 B2
(45) Date of Patent: *Sep. 29, 2020

(54) NAPHTHOL AS—PIGMENT-MIXTURES

(71) Applicant: CLARIANT PLASTICS & COATINGS LTD, Muttenz (CH)

(72) Inventors: Ulrike Rohr, Weinheim (DE); Joachim Eichhorn, Frankfurt am Main (DE)

(73) Assignee: Clariant Plastics & Coatings Ltd, Muttenz (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/738,875

(22) PCT Filed: Jun. 20, 2016

(86) PCT No.: PCT/EP2016/064200
§ 371 (c)(1),
(2) Date: Dec. 21, 2017

(87) PCT Pub. No.: WO2016/207113
PCT Pub. Date: Dec. 29, 2016

(65) Prior Publication Data
US 2018/0187016 A1    Jul. 5, 2018

(30) Foreign Application Priority Data
Jun. 25, 2015    (DE) .................. 10 2015 211 828

(51) Int. Cl.
| | | |
|---|---|---|
| C09B 67/22 | (2006.01) | |
| C08K 5/23 | (2006.01) | |
| C09D 7/41 | (2018.01) | |
| G03F 7/00 | (2006.01) | |
| G03F 7/004 | (2006.01) | |
| C08K 5/00 | (2006.01) | |

(52) U.S. Cl.
CPC ............ C09B 67/0051 (2013.01); C08K 5/23 (2013.01); C09D 7/41 (2018.01); G03F 7/0007 (2013.01); G03F 7/0045 (2013.01); *C08K 5/0041* (2013.01); *C08K 2201/014* (2013.01)

(58) Field of Classification Search
CPC . C09B 35/029; C09B 67/0051; C09D 11/037; G03G 9/091; C08K 2201/014
See application file for complete search history.

(56) References Cited

U.S. PATENT DOCUMENTS

| | | | | |
|---|---|---|---|---|
| 2,006,211 A | * | 6/1935 | Fischer ................. | C08K 5/23 524/190 |
| 6,271,286 B1 | * | 8/2001 | Leidner ................. | C09D 13/00 523/164 |
| 2008/0241722 A1 | * | 10/2008 | Schmidt .............. | C09B 67/0051 430/105 |
| 2018/0312704 A1 | * | 11/2018 | Rohr .................... | C09B 29/0003 |

FOREIGN PATENT DOCUMENTS

| | | | |
|---|---|---|---|
| CN | 1315473 A | | 10/2001 |
| CN | 106118120 A | * | 11/2016 |
| JP | 2002156776 A | * | 5/2002 |
| JP | 2004126120 A | | 4/2004 |
| SU | 1520082 A1 | * | 11/1989 |
| WO | 2005/019346 A1 | | 3/2005 |

OTHER PUBLICATIONS

Herbst, W.; Hunger, K. Industrial Organic Pigments. Wiley-VCH Verlag GmbH & Co: Weinheim. pp. 286-288. (Year: 2004).*
International Search Reported dated Sep. 16, 2016, issued in International Application No. PCT/EP2016/064200.
Written Opinion of the International Search Reported dated Sep. 16, 2016, issued in International Application No. PCT/EP2016/064200, German and English.

* cited by examiner

*Primary Examiner* — Christopher D RoDee
(74) *Attorney, Agent, or Firm* — Morgan, Lewis & Bockius LLP

(57) ABSTRACT

The invention relates to azo pigment mixtures which contain at least one azo pigment of formula (IIIa) and at least one azo pigment of formula (IIIb)

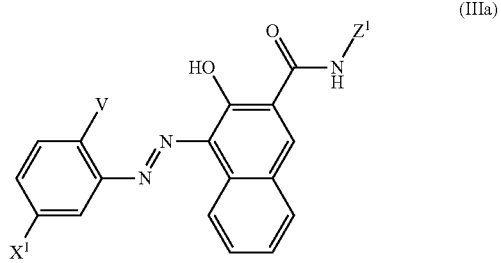

(IIIa)

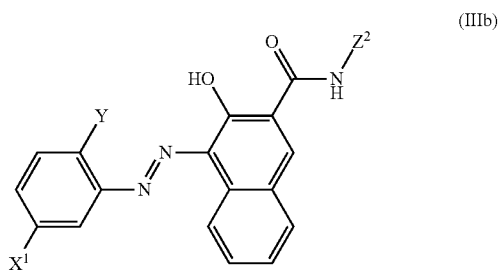

(IIIb)

where $X^1$, Y, $Z^1$ and V in formula (IIIa) and formula (IIIb) are independent of each other and are defined as described, and the azo pigments of formula (IIIa) and formula (IIIb) are different.

7 Claims, No Drawings

NAPHTHOL AS—PIGMENT-MIXTURES

The present invention is in the field of the azo pigments.

Naphthol AS pigments are of particular industrial interest, since they usually attain high color intensities and cover the magenta region of the process color set. In addition, they have good lightfastness. It is often a requirement, however, that they have high brilliance (chroma) as well as the bluish-red magenta hue. The combination of these two requirements has to date been achievable only by mixing the azo pigments with fractions of quinacridone pigments, for example PR 122, but this then has a disadvantageous effect on color intensity and process costs.

The present invention now describes mixtures of naphthol AS pigments which surprisingly do not have this disadvantage, the colors of which have a bright magenta hue with simultaneously high color intensity and transparency, and which have low costs.

The invention provides mixtures of naphthol AS pigments each comprising at least one naphthol AS pigment of the formulae (Ia) and (Ib)

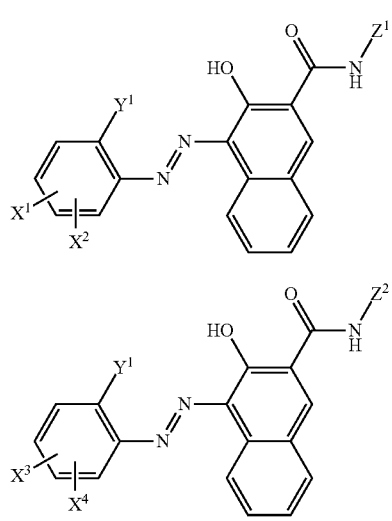

in which, independently of one another, $X^1$, $X^3$ are carbamoyl, $C_1$-$C_4$-alkylcarbamoyl, di($C_1$-$C_4$)-alkylcarbamoyl, sulfamoyl, phenylsulfamoyl, $C_1$-$C_4$-alkylsulfamoyl or di($C_1$-$C_4$)-alkylsulfamoyl;

$X^2$, $X^4$ are hydrogen, $C_1$-$C_4$-alkyl, $C_1$-$C_4$-alkoxy, halogen or nitro;

$Y^1$, $Y^2$ are hydrogen, $C_1$-$C_4$-alkyl, $C_1$-$C_4$-alkoxy, halogen or $C_1$-$C_4$-alkoxycarbonyl; and $Z^1$, $Z^2$ are hydrogen, phenyl, naphthyl, benzimidazolonyl, substituted phenyl or substituted naphthyl, where the substituents are 1, 2, 3 or 4 in number and are selected from the group of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-acylamino, $C_1$-$C_4$-alkyl and $C_1$-$C_4$-alkoxy, and where the pigments of the formulae (Ia) and (Ib) are different.

In the above formulae, $X^1$, $X^3$ are preferably carbamoyl, $C_1$-$C_4$-alkylcarbamoyl, di($C_1$-$C_4$)-alkylcarbamoyl, more preferably carbamoyl, $C_1$-$C_2$-alkylcarbamoyl or di($C_1$-$C_2$)-alkylcarbamoyl.

In the above formulae, $X^2$, $X^4$ are preferably hydrogen, $C_1$-$C_4$-alkyl or $C_1$-$C_4$-alkoxy, more preferably hydrogen.

In the above formulae, $Y^1$, $Y^2$ are preferably $C_1$-$C_4$-alkyl or $C_1$-$C_4$-alkoxy, more preferably methyl, ethyl, methoxy or ethoxy.

In the above formulae, $Z^1$, $Z^2$ are preferably hydrogen, phenyl, or nitro-, cyano-, halogen-, $C_1$-$C_4$-alkyl- and/or $C_1$-$C_4$-alkoxy-substituted phenyl, more preferably phenyl or nitro-, methyl-, ethyl-, methoxy- and/or ethoxy-substituted phenyl.

Preference is given in the context of the present invention to mixtures of naphthol AS pigments each comprising at least one naphthol AS pigment of the formulae (IIa) and (IIb)

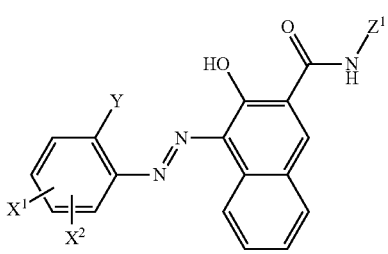

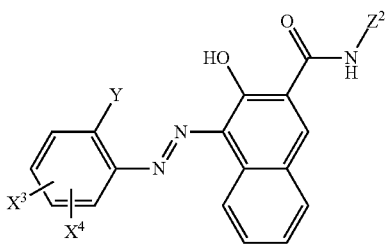

in which, independently of one another, $X^1$ is carbamoyl, $C_1$-$C_4$-alkylcarbamoyl, di($C_1$-$C_4$)-alkylcarbamoyl, sulfamoyl, phenylsulfamoyl, $C_1$-$C_4$-alkylsulfamoyl or di($C_1$-$C_4$)-alkylsulfamoyl;

$X^2$ is hydrogen, $C_1$-$C_4$-alkyl, $C_1$-$C_4$-alkoxy, halogen or nitro;

Y is hydrogen, $C_1$-$C_4$-alkyl, $C_1$-$C_4$-alkoxy, halogen or $C_1$-$C_4$-alkoxycarbonyl; and $Z^1$, $Z^2$ are hydrogen, phenyl, naphthyl, benzimidazolonyl, substituted phenyl or substituted naphthyl, where the substituents are 1, 2, 3 or 4 in number and are selected from the group of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-acylamino, $C_1$-$C_4$-alkyl and $C_1$-$C_4$-alkoxy, and where the pigments of the formulae (IIa) and (IIb) are different.

Particular preference is given to above-described mixtures where $X^2$ is defined as hydrogen.

Very particular preference is given to above-described mixtures where $X^2$ is defined as hydrogen and $X^1$ is in the para position to Y.

In the above formulae, halogen is preferably F, Cl or Br, especially Cl.

The invention especially provides mixtures of naphthol AS pigments each comprising at least one naphthol AS pigment of the formulae (IIIa) and (IIIb)

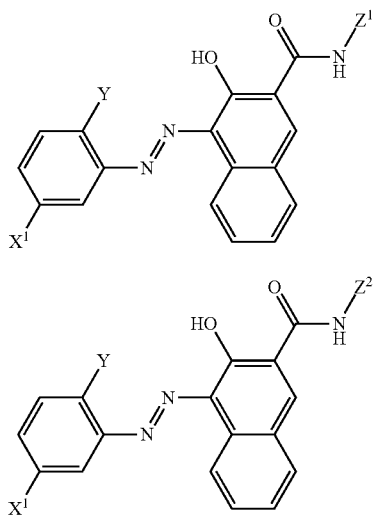

(IIIa)

(IIIb)

in which, independently of one another, $X^1$ is defined as carbamoyl, $C_1$-$C_2$-alkylcarbamoyl or di($C_1$-$C_2$)-alkylcarbamoyl;

Y is defined as methyl, methoxy, ethyl or ethoxy;

$Z^1$ is defined as phenyl or as phenyl substituted by one, two or three radicals from the group of methyl, ethyl, methoxy, ethoxy, chlorine;

$Z^2$ is defined as nitrophenyl or cyanophenyl.

Of particular interest are mixtures of naphthol AS pigments each comprising at least one naphthol AS pigment of the above formulae (IIIa) and (IIIb), in which $X^1$ is defined as carbamoyl, methylcarbamoyl or ethylcarbamoyl;

Y is defined as methoxy or ethoxy;

$Z^1$ is defined as methylphenyl, ethylphenyl, methoxyphenyl or ethoxyphenyl; and $Z^2$ is defined as nitrophenyl or cyanophenyl.

Of very particular interest are mixtures of naphthol AS pigments each comprising at least one naphthol AS pigment of the above formulae (IIIa) and (IIIb), in which $X^1$ is defined as carbamoyl or methylcarbamoyl;

Y is defined as methoxy;

$Z^1$ is defined as methylphenyl, especially o-methylphenyl; and $Z^2$ is defined as nitrophenyl, especially m-nitrophenyl.

The pigment mixtures of the invention appropriately contain 1% to 99% by weight of a component of the formula (Ia), (IIa) or (IIIa) and 99% to 1% by weight of a component of the formula (Ib), (IIb) or (IIIb), preferably 5% to 95% by weight of a component of the formula (Ia), (IIb) or (IIIa) and 95% to 5% by weight of a component of the formula (Ib), (IIIb) or (IIIb), more preferably 10% to 90% by weight of a component of the formula (Ia), (IIa) or (IIIa) and 90% to 10% by weight of a component of the formula (Ib), (IIb) or (IIIb), even more preferably 25% to 75% by weight of a component of the formula (Ia), (IIa) or (IIIa) and 75% to 25% by weight of a component of the formula (Ib), (IIb) or (IIIb), especially 30% to 70% by weight of a component of the formula (Ia), (IIa) or (IIIa) and 70% to 30% by weight of a component of the formula (Ib), (IIb) or (IIIb), based in each case on the total weight of the pigment mixture.

The pigment mixtures of the invention optionally contain one or more additional colorants of the formula (IV) in proportions of up to 10% by weight, for example from 0.1% to 10% by weight, based on the total weight of the pigment mixture,

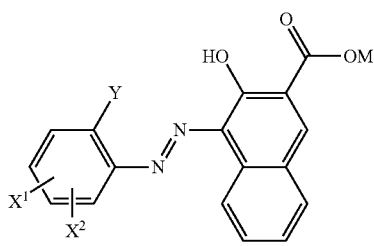

(IV)

in which $X^1$, $X^2$, Y have one of the definitions given above and

M is hydrogen, an alkali metal, an alkaline earth metal or ammonium.

The pigment mixtures of the invention may additionally optionally comprise one or more residual couplers from the group of the β-naphthol derivatives of the formula (VIa) and/or (VIb) in proportions of up to 10% by weight, for example of 0.1% to 10% by weight, based on the total weight of the pigment mixture,

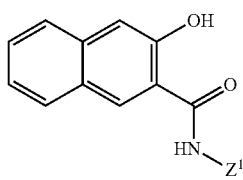

(VIa)

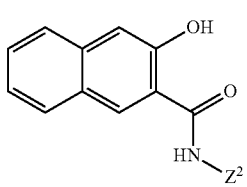

(VIb)

in which $Z^1$ and $Z^2$ have one of the definitions given above.

The pigment mixtures of the invention can be prepared by diazotization of amines of the formulae (Va) and (Vb)

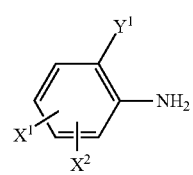

(Va)

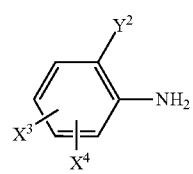

(Vb)

in an acidic medium and subsequent coupling of the diazonium compounds thus obtained to a mixture of at least two coupling components of the formulae (VIa) and (VIb)

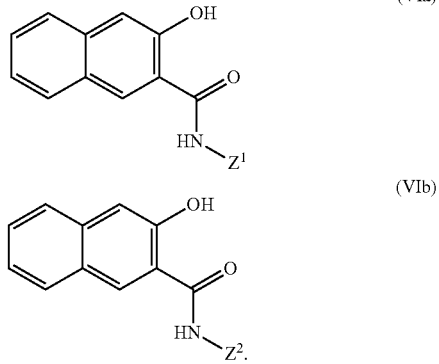

Subsequently, the pigment suspension obtained can be filtered and the moist presscake obtained can appropriately be dried to constant weight.

In the case that the amines of the formula (Va) and (Vb) are the same, two equivalents of the amine in question are correspondingly diazotized and coupled as described above.

Alternatively, the pigment mixtures of the invention can also be prepared by co-sublimation under reduced pressure or by mixing the separately prepared individual components of the formulae (Ia) and (Ib), for example by means of a mill or by suitable kneading processes or in aqueous suspension, optionally with addition of acid such as sulfuric acid or of an organic solvent or in pure organic solvent, and optionally while heating under pressure or at ambient pressure, followed by isolation by filtration or after removal of the solvent by distillation. Examples of organic solvents suitable for this purpose include dimethylformamide, N-methylpyrrolidone, ortho-dichlorobenzene or alcohols such as isobutanol, ether alcohols or carboxylic acids such as acetic acid, trifluoroacetic acid or dichloroacetic acid.

The azo coupling reaction is preferably effected in aqueous solution or suspension, and preferably at a pH between 3 and 9, but it is also possible to use organic solvents, optionally in a mixture with water, for example alcohols having 1 to 10 carbon atoms, for example methanol, ethanol, n-propanol, isopropanol, butanols such as n-butanol, sec-butanol, tert-butanol, pentanols such as n-pentanol, 2-methyl-2-butanol, hexanols such as 2-methyl-2-pentanol, 3-methyl-3-pentanol, heptanols such as 2-methyl-2-hexanol, 3-ethyl-3-pentanol, octanols such as 2,4,4-trimethyl-2-pentanol, cyclohexanol; or glycols such as ethylene glycol, diethylene glycol, propylene glycol, dipropylene glycol, or glycerol; or polyglycols such as polyethylene glycols or polypropylene glycols; ethers such as methyl isobutyl ether, tetrahydrofuran or dimethoxyethane; glycol ethers such as monomethyl or monoethyl ethers of ethylene glycol or propylene glycol, diethylene glycol monomethyl ether, diethylene glycol monoethyl ether, butylglycols or methoxybutanol; ketones such as acetone, diethyl ketone, methyl isobutyl ketone, methyl ethyl ketone or cyclohexanone; aliphatic acid amides such as formamide, dimethylformamide, N-methylacetamide or N,N-dimethylacetamide; urea derivatives such as tetramethylurea; or cyclic carboxamides such as N-methylpyrrolidone, valerolactam or caprolactam; esters such as $C_1$-$C_6$-alkyl carboxylates such as butyl formate, ethyl acetate or propyl propionate; or $C_1$-$C_6$ glycol carboxylates; or glycol ether acetates such as 1-methoxy-2-propyl acetate; or $C_1$-$C_6$-alkyl phthalates or benzoates such as ethyl benzoate; cyclic esters such as caprolactone; nitriles such as acetonitrile or benzonitrile; aliphatic or aromatic hydrocarbons such as cyclohexane or benzene; or alkyl-, alkoxy-, nitro- or halogen-substituted benzene such as toluene, xylenes, ethylbenzene, anisole, nitrobenzene, chlorobenzene, o-dichlorobenzene, 1,2,4-trichlorobenzene or bromobenzene; or other substituted aromatics such as benzoic acid or phenol; aromatic heterocycles such as pyridine, morpholine, picoline or quinoline; and hexamethylphosphoramide, 1,3-dimethyl-2-imidazolidinone, dimethyl sulfoxide and sulfolane. The solvents mentioned can also be used in the form of mixtures. Preference is given to using water-miscible solvents.

A finish optionally conducted after the pigment synthesis comprises the taking-up of the naphthol AS pigment mixture prepared, either directly from the synthesis or after intermediate isolation, for example as a presscake (solids content typically about 5% to 30% by weight), in one of the abovementioned organic solvents.

Preferred solvents here are $C_3$-$C_4$ alcohols, glycol ethers and chlorinated benzenes, for example isopropanol, isobutanol, butoxyethanol, ortho-dichlorobenzene or a mixture thereof.

The amount of the solvent is preferably 1% to 30% by volume, especially 5% to 15% by volume, based on the volume of the pigment suspension, or 1 to 10 times the weight of solvent, based on the total weight of the pigment in the presscake.

The pigment finish is preferably conducted at a temperature between 20° C. and 150° C., especially between 40° C. and 90° C., optionally under pressure, and preferably for 0.1 to 2 hours, especially 0.25 to 1 hour, and preferably at standard pressure and preferably while stirring.

Useful stirring apparatus is standard stirring apparatus, for example laboratory stirrers. An alternative in principle is to use an inline dispersing machine equipped with appropriate dispersing tools in the pumped circulation system of the reservoir vessel. A dispersing machine of this kind firstly assures vigorous mixing of the suspension in the reservoir vessel, but simultaneously also has a deagglomerating effect, such that any inclusions are released.

Subsequently, the solvent-treated pigment suspension is filtered and washed.

For establishment of the desired particle size distribution and the associated performance properties, for example dispersibility, brilliance, hue and contrast value, the pigment mixtures of the invention can also be subjected to a fine distribution operation. The desired particle size distribution is guided here by the desired field of use.

If the colorant composition of the invention is being used, for example, in the form of a dispersed colorant in a millbase for color filters, it is advantageous first to establish a small primary particle size in a suitable manner. Particularly suitable primary particle sizes for this application are less than 60 nm, preferably less than 40 nm, in terms of the d50. It is likewise advantageous to establish a narrow particle size distribution.

The particle size distribution after comminution preferably approximates to a Gaussian distribution in which the standard deviation sigma is preferably less than 30 nm, more preferably less than 20 nm. In general, the standard deviations are between 5 and 30 nm, preferably between 6 and 25 nm, especially between 7 and 20 nm.

The standard deviation sigma (σ) corresponds to the positive square root of the variance. The variance v is the sum of the squared deviations from the mean divided by the number of samples minus 1. It is also advantageous for the color filter application when the d95 of the comminuted particles is not more than 70 nm.

The length to width ratio of the comminuted particles for the color filter application is preferably between 2:1 and 1:1.

For the fine distribution in general, one option is salt kneading with a crystalline inorganic salt in the presence of an organic solvent. Examples of useful crystalline inorganic salts include aluminum sulfate, sodium sulfate, calcium chloride, potassium chloride or sodium chloride, preferably sodium sulfate, sodium chloride and potassium chloride. Examples of organic solvents include ketones, esters, amides, sulfones, sulfoxides, nitro compounds, mono-, bis- or tris-hydroxy-$C_2$-$C_{12}$-alkanes which may be substituted by $C_1$-$C_8$-alkyl and one or more hydroxyl groups. Particular preference is given to water-miscible high-boiling organic solvents based on monomeric, oligomeric and polymeric $C_2$-$C_3$-alkylene glycols, for example diethylene glycol, diethylene glycol monomethyl and monoethyl ether, triethylene glycol, triethylene glycol monomethyl and monoethyl ether, dipropylene glycol, dipropylene glycol monomethyl and monoethyl ether, propylene glycol monomethyl and monoethyl ether and liquid polyethylene glycols and polypropylene glycols, N-methylpyrrolidone, and additionally triacetin, dimethylformamide, dimethylacetamide, ethyl methyl ketone, cyclohexanone, diacetone alcohol, butyl acetate, nitromethane, dimethyl sulfoxide and sulfolane.

The weight ratio between the inorganic salt and the compound of the formula (I) is preferably (2 to 10): 1, especially (3 to 7):1. The weight ratio between the organic solvent and the inorganic salt is preferably (1 mL:10 g) to (2 mL:7 g). The weight ratio between the organic solvent and the sum total of inorganic salt and the colorant composition of the invention is preferably (1 mL:2 g) to (1 mL:10 g).

The temperature during the kneading may be between 40 and 140° C., preferably 60 to 120° C. The kneading time is appropriately 4 h to 32 h, preferably 8 h to 20 h.

After the salt kneading, the inorganic salt and the organic solvent are appropriately removed by washing with water, and the comminuted colorants thus obtained are dried by standard methods.

The material obtained after the fine distribution can optionally be subjected to a solvent after treatment (finishing treatment) in the form of a suspension, filtercake or dry material for the color filter application, in order to obtain a more homogeneous particle shape without noticeably increasing the particle size. Preference is given to the use of steam-volatile solvents such as alcohols and aromatic solvents, more preferably branched or unbranched $C_1$-$C_6$ alcohols, toluene, xylene, chlorobenzene, dichlorobenzene, nitrotoluene or nitrobenzene, usually at elevated temperature, for example up to 200° C., and optionally under elevated pressure.

In the process of the invention, it is also possible to use auxiliaries, for example surfactants, pigmentary or nonpigmentary dispersants, fillers, standardizers, resins, waxes, defoamers, dust suppressants, extenders, shading colorants, preservatives, drying retardants, rheology control additives, wetting agents, antioxidants, UV absorbers, light stabilizers, or a combination thereof.

The addition of the auxiliaries can be effected at a particular time before, during or after the reaction/synthesis or any fine distribution, all at once or in several portions. The auxiliaries can be added, for example, directly to the solutions or suspensions of the reactants, or else during the reaction in liquid, dissolved or suspended form.

The total amount of the auxiliaries added may be 0% to 40% by weight, preferably 1% to 30% by weight, more preferably 2.5% to 25% by weight, based on the total weight of the pigment mixture plus auxiliaries.

Useful surfactants include anionic or anion-active, cationic or cation-active and nonionic substances or mixtures of these agents.

Examples of surfactants and pigmentary and nonpigmentary dispersants which can be used for the process of the invention are specified in EP-A-1 195 411.

Since compliance with a desired pH during and after the reaction is often crucial for quality, it is also possible to feed in buffer solutions, preferably of organic acids and salts thereof, for example formic acid/formate buffer, acetic acid/acetate buffer, citric acid/citrate buffer; or of inorganic acids and salts thereof, for example phosphoric acid/phosphate buffer or carbonic acid/hydrogencarbonate or carbonate buffer.

In order to adjust the hue or to adapt it further for specific applications, the pigment mixtures of the invention can be combined/mixed with further organic and/or inorganic color pigments and/or with dyes.

Organic color pigments can be selected for this purpose from the group of the azo pigments and/or polycyclic pigments, for example yellow pigments, such as C.I. Pigment Yellow 155, P.Y. 139, P.Y. 83, P.Y. 181, P.Y. 191, P.Y. 75, P.Y. 180, P.Y. 97, P.Y. 213 or P.Y. 214; orange pigments, such as Pigment Orange 62, P.O. 36, P.O. 34, P.O. 13, P.O. 36, P.O. 13, P.O. 43, P.O. 5 or P.O. 73; red/magenta pigments, such as Pigment Red 57, P.R. 48, P.R. 122, P.R. 146, P.R. 147, P.R. 269, P.R. 154, P.R. 185, P.R. 184, P.R. 192, P.R. 202, P.R. 207, P.R. 206, P.R. 209 or P.R. 254; and violet pigments, such as Pigment Violet 19, P.V. 23, P.V. 29, P.V. 35 or P.V. 37, P.V. 57 and likewise blue pigments, such as Pigment Blue 15, P.B. 60 or P.B. 80.

Preferred shading colorants are quinacridone pigments or a naphthol AS pigment other than the compound of the formula (Ia) and (Ib).

For use in the field of color filters for LCD displays and OLED displays, further components that may be used in the color film for the red region, in addition to the red/magenta pigments already mentioned, include the following pigments in mixtures with the compositions of the invention: C.I. Pigment Red 149, P.R. 166, P.R. 168, P.R. 177, P.R. 242, P.R. 264, and further diketopyrrolopyrroles, especially brominated diketopyrrolopyrroles as described in WO2009/144115A1, and diketopyrrolopyrrole compositions as described in WO2009/049736A2, EP2146230B1 and EP2236562A1. For this end use, particular preference is given to P.R. 177, P.R. 209, P.R. 242, P.R. 254, P.R. 264, and the aforementioned brominated diketopyrrolopyrroles and the aforementioned diketopyrrolopyrrole compositions.

Preferred dyes which can be used for shading of the pigment mixtures of the invention are water-soluble dyes from the group of the direct dyes, reactive dyes and acid dyes, and also dyes from the group of the solvent dyes, disperse dyes and vat dyes. Specific examples of these include C.I. Reactive Yellow 37, Acid Yellow 23, Reactive Red 23, 180, Acid Red 52, Reactive Blue 19, 21, Acid Blue 9, Direct Blue 199, Solvent Yellow 14, 16, 25, 56, 64, 79, 81, 82, 83:1, 93, 98, 133, 160:1, 162, 174, Solvent Red 8, 19, 24, 49, 89, 90, 91, 109, 118, 119, 122, 127, 135, 160, 195, 212, 215, Solvent Blue 44, 45, Solvent Orange 60, 63, Disperse Yellow 64, Vat Red 41, Solvent Violet 59.

The naphthol AS pigment mixtures of the invention are notable for a magenta hue in the blue region combined with high brilliance (chroma), which makes the pigment mixtures of the invention attractive for many industrial uses. For instance, they can be used for pigmentation of high molecular weight organic materials of natural or synthetic origin, for example of plastics, resins, varnishes, paints and seed. It is likewise possible to use the pigment mixtures of the invention in color filters for LCD displays and OLED displays. They are notable for comparatively high color intensity and a good contrast ratio therein.

It is unimportant here whether the high molecular weight organic compounds are in the form of powder, plastic masses, melts or spin solutions, or of dispersions, varnishes or paints. According to the end use, it is found to be advantageous to use the naphthol AS pigment mixtures of the invention as a blend or in the form of preparations or dispersions. Based on the high molecular weight organic material to be pigmented, the naphthol AS pigment mixtures of the invention are usually used in an amount of 0.05% to 30% by weight, preferably 0.1% to 15% by weight.

Specifically for use in color filters, it is also possible to use higher proportions of up to 60% pigment, based on the mass of the film, preferably 30%-50%.

In the examples which follow, parts mean parts by weight and percent means percent by weight.

SYNTHESIS EXAMPLE 1a a1) Preparation of the Diazonium Salt Solution:

2200 g of demineralized water are initially charged, 180 g of N-methyl-3-amino-4-methoxybenzamide (1.0 mol) are scattered in and the mixture is stirred homogeneously at room temperature. After 15 minutes, the mixture is cooled to 2° C. by adding 800 g of ice and by additional external cooling, and then 290 g of hydrochloric acid (31%) are added. The precipitated hydrochloride is diazotized by adding 179 g of sodium nitrite solution (40%) at 5 to 10° C. over the course of 15 to 20 minutes. The diazonium salt solution is stirred in an excess of nitrite for 1.5 h, then a clarifying aid is added and then the mixture is filtered and any nitrite excess is eliminated by addition of amidosulfonic acid.

a2) Preparation of a Solution of the Coupling Component Mixture:

2000 g of water are initially charged and 186 g (0.67 mol) of N-(2-methylphenyl)-3-hydroxynaphthalene-2-carboxamide and 103 g (0.33 mol) of N-(3-nitrophenyl)-3-hydroxynaphthalene-2-carboxamide are introduced while stirring, and the mixture is heated to 95° C. and dissolved under alkaline conditions by adding 330 g of sodium hydroxide solution (33%) at 90 to 95° C. within a few minutes. Subsequently, the mixture is cooled to from 80° C. to 60° C. and kept at this temperature. The warm solution can optionally still be filtered with addition of a clarifying aid.

a3) Azo Coupling:

The clarified diazonium salt solution from a1) is initially charged, adjusted to pH 4.3 to 4.5 by adding about 38 g of sodium acetate (in the form of a 4 N solution), and cooled to 10° C. Thereafter, the coupler solution from a2) is metered in over the course of 1 to 1.5 h while stirring, while keeping the pH at 4.8 to 5 by simultaneous addition of a total of about 190 g of hydrochloric acid (31%).

Subsequently, the mixture is stirred for about 2.5 to 3 h or until the disappearance of the diazo component at RT to 30° C. and pH 5 to 6. After the coupling reaction has ended, the mixture is heated to about 50° C. for another 1 h, then filtered and washed with water. After drying and grinding, 480 g of the inventive bluish dark red pigment mixture containing the following pigments of the formulae (1) and (2) in a mass ratio of 65:35 are obtained:

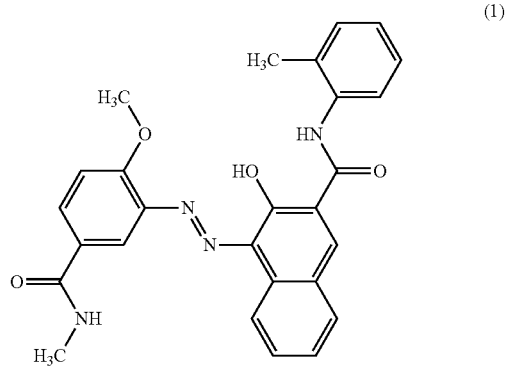

(1)

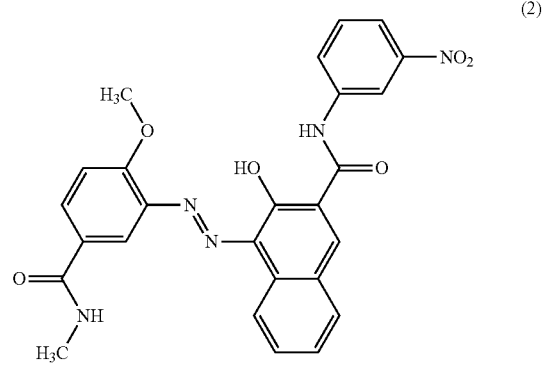

(2)

SYNTHESIS EXAMPLE 1b

The preparation of the diazonium salt solution is accomplished analogously to example 1a, a1).

The preparation of the solution of the coupling component mixture is accomplished analogously to example 1a, a2).

a3) Azo Coupling:

3000 g of water/ice are initially charged, 280 g of acetic acid and 110 g of sodium acetate (in the form of a 4 N solution) are added and the pH is adjusted to 4. The temperature is adjusted to 10° C. and then, with good stirring, the solution of the coupling components from a2) is added dropwise, in the course of which they precipitate out and give rise to a suspension. The temperature is kept at 10 to 15° C. by addition of ice and, on completion of coupler addition, the pH is adjusted to 5. The diazo solution from a1) is added dropwise to the coupler suspension over the course of 1.5 h and pH is kept at 5 to 5.5 with sodium hydroxide solution. After the diazo addition has ended, the mixture is stirred at RT to 30° C. and pH 5.5 to 6.5 until the diazo component has disappeared. After the coupling reaction has ended, the mixture is heated to about 50° C. for another 1 h, then filtered and washed with water. After drying and grinding, 480 g of an inventive dark red pigment mixture containing the pigments of the formulae (1) and (2) in a mass ratio of 65:35 are obtained.

The pigment mixtures listed in table 1 below were prepared analogously to example 1a or 1 b:

TABLE 1

| Example | Pigment of formula (1a) | Pigment of formula (1b) | Mixing ratio |
|---|---|---|---|
| 2 | (1) | (2) | 50:50 |
| 3 | (1) | (2) | 30:70 |
| 4 | 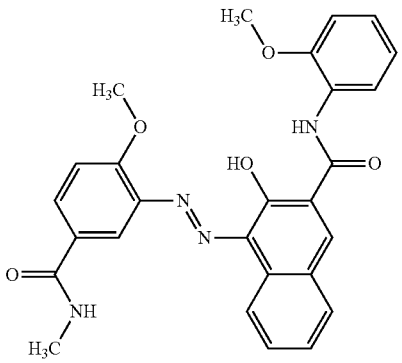 (3) | 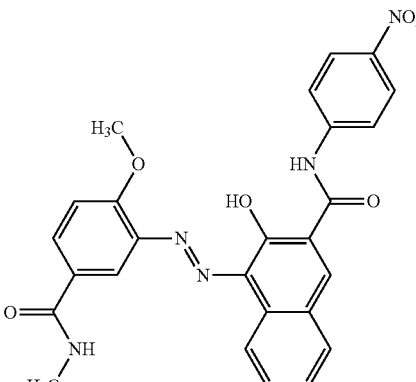 (4) | 70:30 |
| 5 | 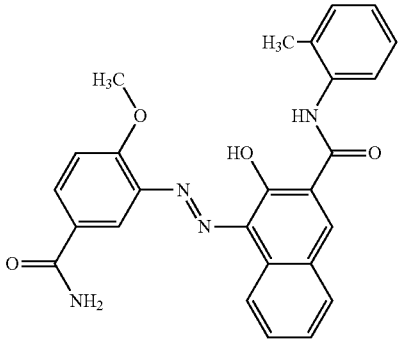 (5) | 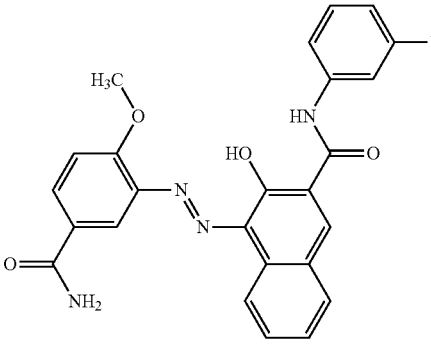 (6) | 60:40 |
| 6 | 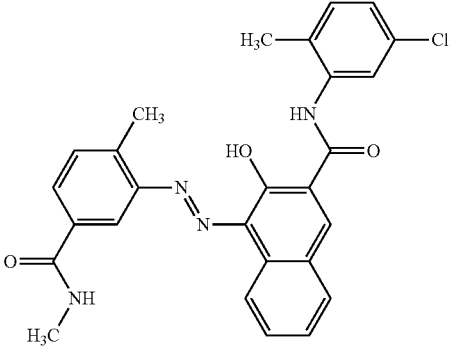 (7) | 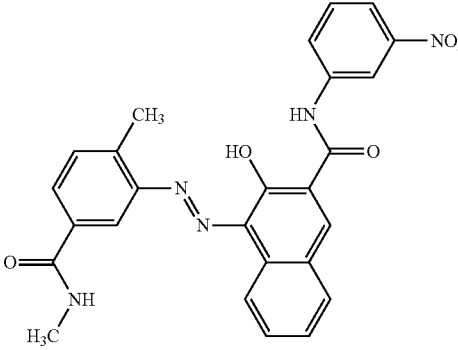 (8) | 65:35 |

TABLE 1-continued
| Example | Pigment of formula (1a) | Pigment of formula (1b) | Mixing ratio |
|---|---|---|---|
| 7 | 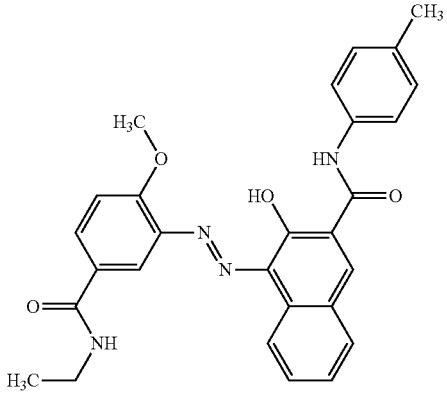 (9) | 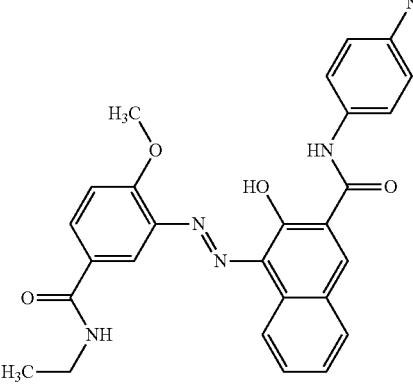 (10) | 60:40 |
| 8 | 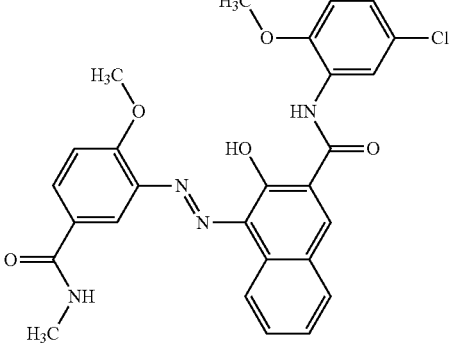 (11) | 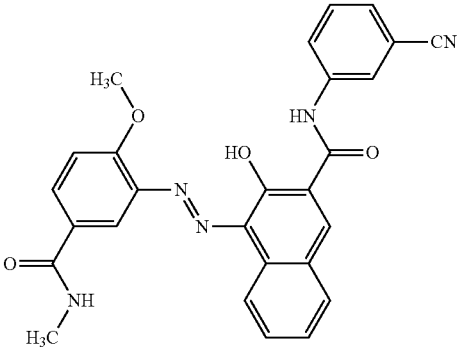 (12) | 80:20 |
| 9 | 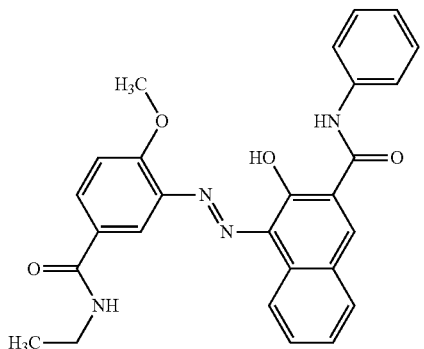 (13) | 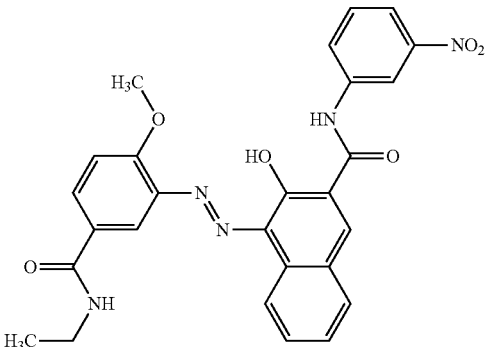 (14) | 65:35 |

TABLE 1-continued
| Example | Pigment of formula (1a) | Pigment of formula (1b) | Mixing ratio |
|---|---|---|---|
| 10 | 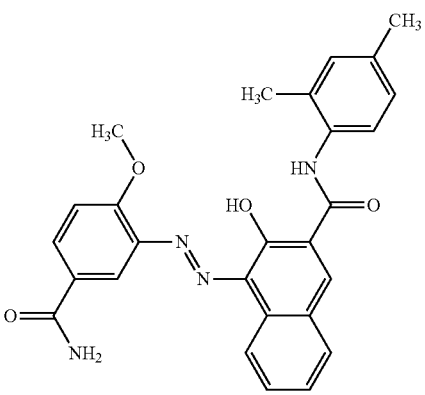<br>(15) | 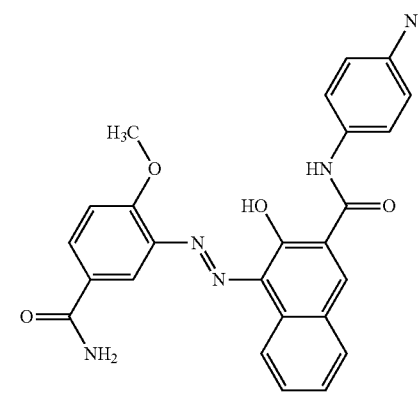<br>(16) | 70:30 |
| 11 | 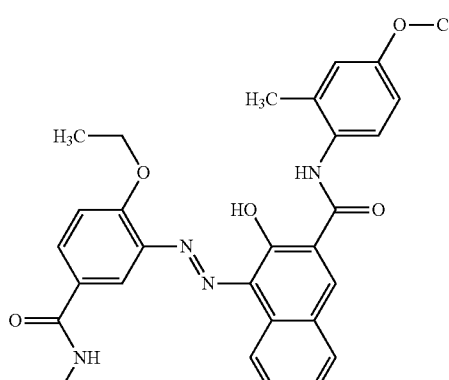<br>(17) | 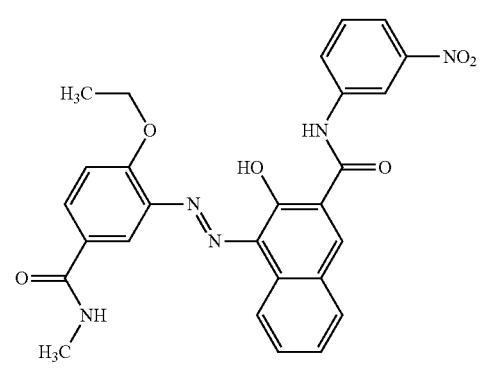<br>(18) | 75:25 |
| 12 | 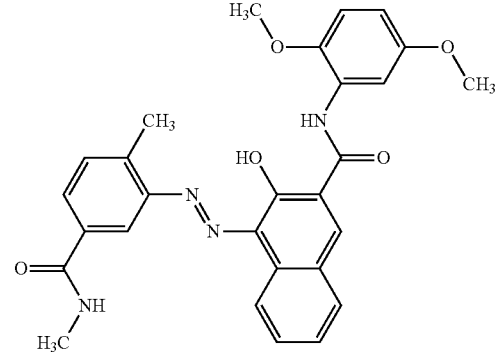<br>(19) | 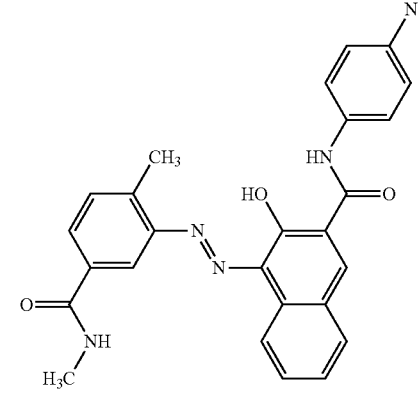<br>(20) | 55:45 |

TABLE 1-continued
| Example | Pigment of formula (1a) | Pigment of formula (1b) | Mixing ratio |
|---|---|---|---|
| 13 | 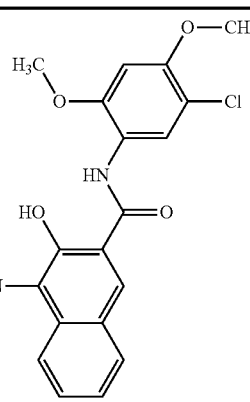 (21) | 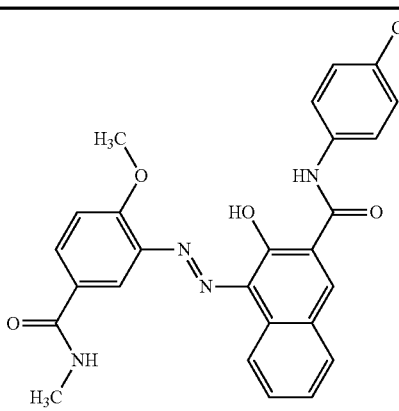 (22) | 70:30 |
| 14 | 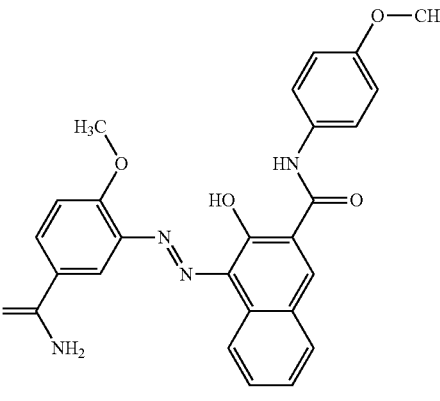 (23) | 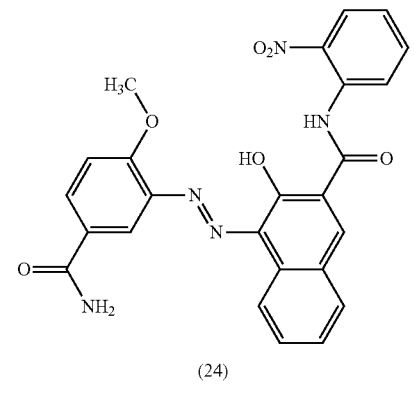 [SMILES: COc1ccc(C(N)=O)cc1/N=N/c1c(O)c(C(=O)Nc2ccccc2[N+](=O)[O-])cc2ccccc12] (24) | 60:40 |
| 15 | 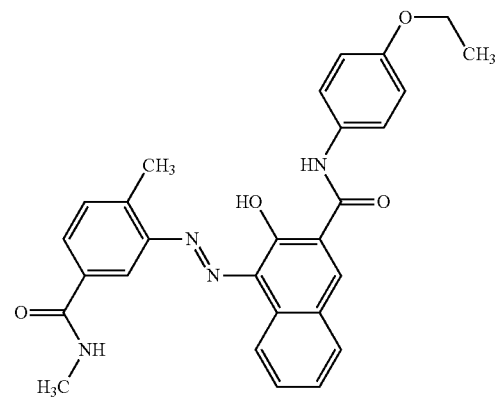 (25) | 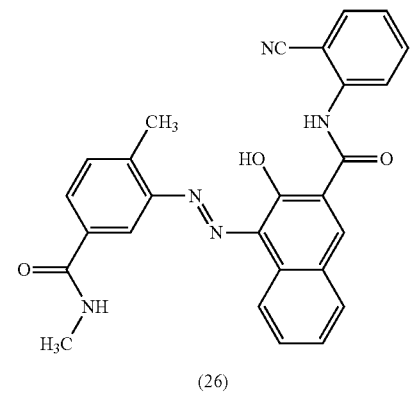 [SMILES: CNC(=O)c1ccc(C)c(/N=N/c2c(O)c(C(=O)Nc3ccccc3C#N)cc3ccccc23)c1] (26) | 50:50 |

TABLE 1-continued
| Example | Pigment of formula (1a) | Pigment of formula (1b) | Mixing ratio |
|---|---|---|---|
| 16 | 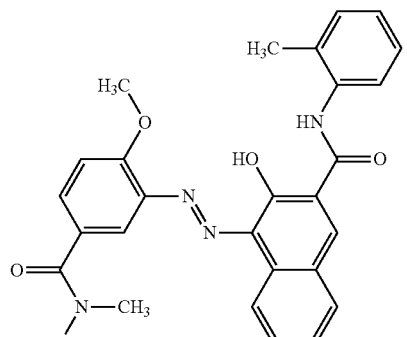 (27) | 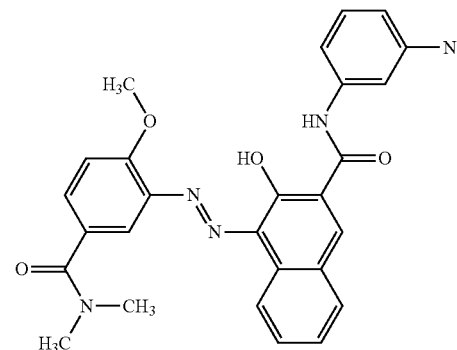 (28) | 65:35 |
| 17 | 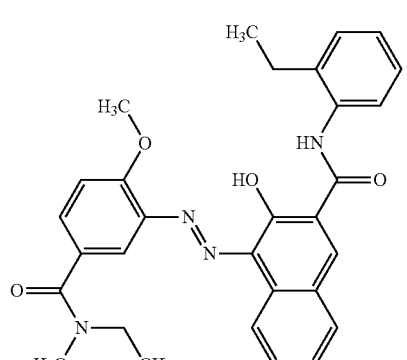 (29) | 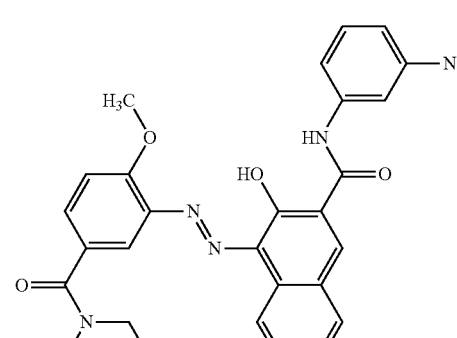 (30) | 60:40 |
| 18 | 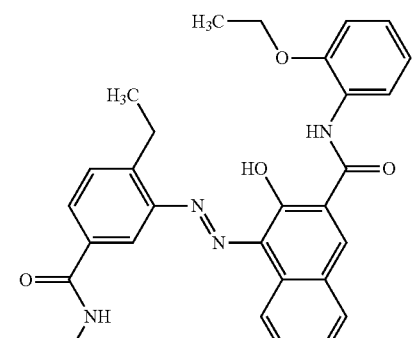 (31) | 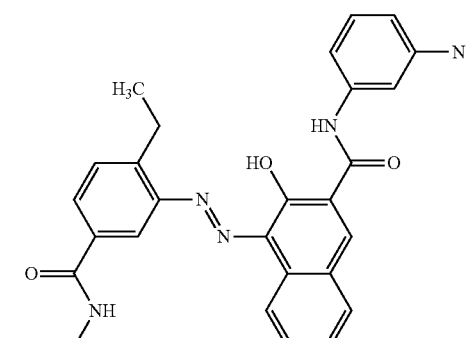 (32) | 67:33 |

TABLE 1-continued

| Example | Pigment of formula (1a) | Pigment of formula (1b) | Mixing ratio |
|---|---|---|---|
| 19 | (33) | (34) | 62:38 |
| 20 | (35) | (36) | 72:28 |
| 21 | (37) | (38) | 60:40 |

TABLE 1-continued

| Example | Pigment of formula (1a) | Pigment of formula (1b) | Mixing ratio |
|---|---|---|---|
| 22 | (39) | (8) | 67:33 |
| 23 | (40) | (2) | 65:35 |
| 24 | (41) | (4) | 60:40 |
| 25 | (42) | (43) | 50:50 |

TABLE 1-continued
| Example | Pigment of formula (1a) | Pigment of formula (1b) | Mixing ratio |
|---|---|---|---|
| 26 | 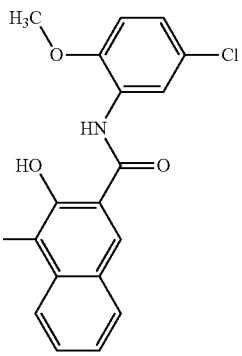 (44) | 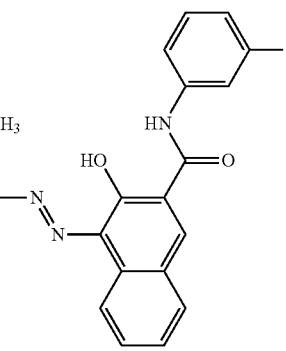 (45) | 66:34 |
| 27 | 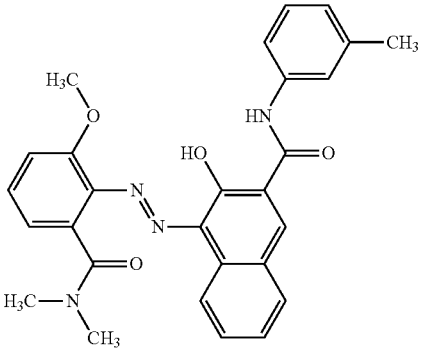 (46) | 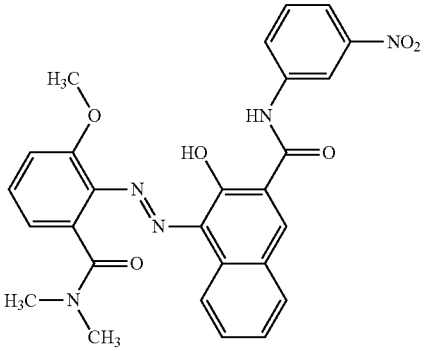 (47) | 75:25 |
| 28 | 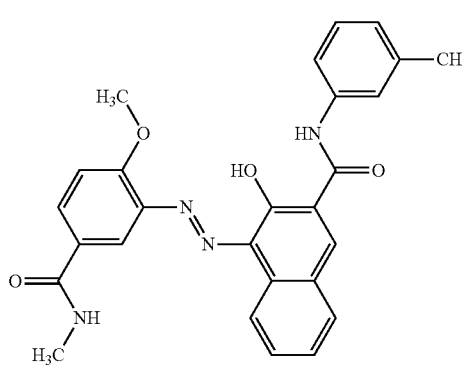 (48) | (2) 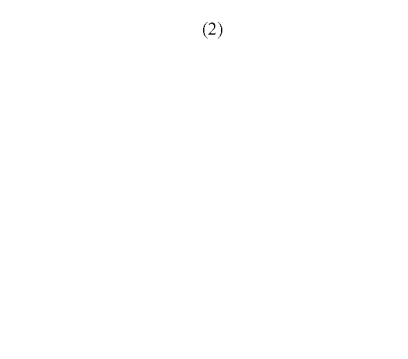 | 80:20 |

TABLE 1-continued
| Example | Pigment of formula (1a) | Pigment of formula (1b) | Mixing ratio |
|---|---|---|---|
| 29 | 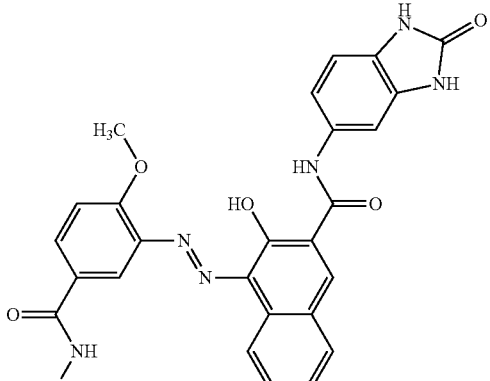 (49) | (2) | 85:15 |
| 30 | 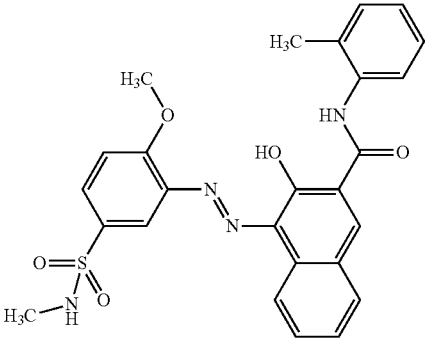 (50) | 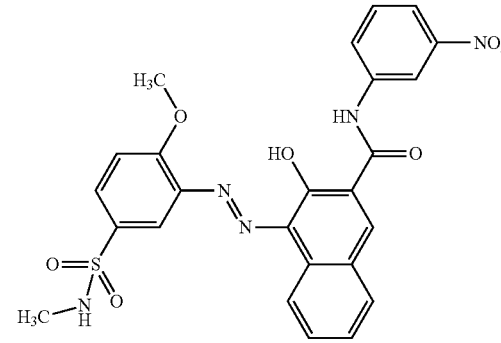 (51) | 60:40 |
| 31 | 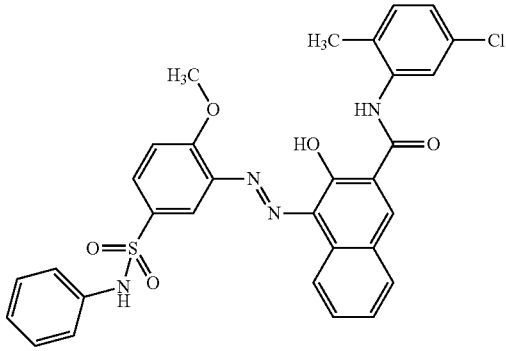 (52) | 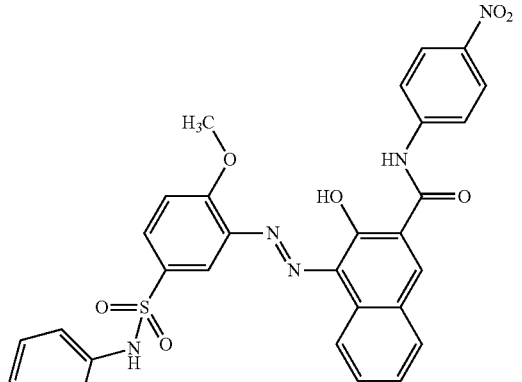 (53) | 67:33 |

TABLE 1-continued

| Example | Pigment of formula (1a) | Pigment of formula (1b) | Mixing ratio |
|---|---|---|---|
| 32 | (54) | (55) | 75:25 |
| 33 | (56) | (57) | 68:32 |
| 34 | (58) | (59) | 78:22 |
| 35 | (1) | (12) | 65:35 |

The inventive pigment mixtures of examples 2 to 35 show the desired bluish-red magenta hue and simultaneously high brilliance.

EXAMPLE 36

65 g of a dry pigment of the formula (3)

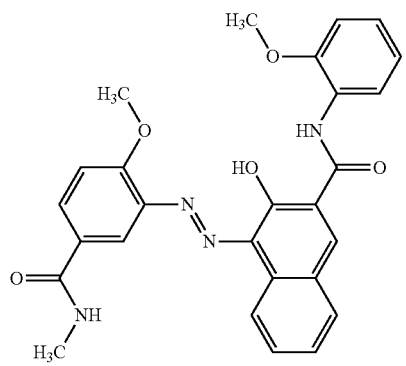
(3)

and 35 g of a dry pigment of the formula (6)

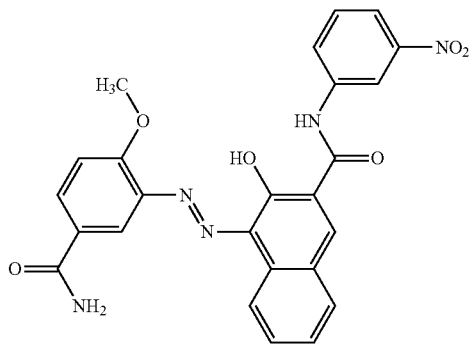
(6)

are mixed and ground homogeneously in a mill. This gives 100 g of an inventive bluish-dark red pigment mixture.

The examples comprising the individual compounds from table 1 that are cited in table 2 below were prepared analogously to example 36:

TABLE 2

| Example | Pigment of formula (Ia) | Pigment of formula (Ib) | Mixing ratio |
| --- | --- | --- | --- |
| 37 | (3) | (2) | 65:35 |
| 38 | (5) | (4) | 65:35 |
| 39 | (37) | (16) | 50:50 |
| 40 | (40) | (20) | 58:42 |
| 41 | (42) | (6) | 60:40 |
| 42 | (49) | (14) | 67:33 |

EXAMPLE 43

70 g of a pigment of the formula (13) and 30 g of a pigment of the formula (2), each in the form of a moist presscake, are introduced into 1000 g of water and homogenized by stirring at RT to 95° C. for a further 1 hour. After filtration, drying and grinding, 100 g of an inventive bluish-dark red pigment mixture are obtained.

The examples comprising the individual compounds from table 1 that are cited in table 3 below were prepared analogously to example 43:

TABLE 3

| Example | Pigment of formula (Ia) | Pigment of formula (Ib) | Mixing ratio |
| --- | --- | --- | --- |
| 44 | (1) | (2) | 65:35 |
| 45 | (1) | (6) | 57:43 |
| 46 | (5) | (2) | 60:40 |
| 47 | (11) | (14) | 70:30 |
| 48 | (23) | (38) | 60:40 |
| 49 | (41) | (8) | 55:45 |
| 50 | (48) | (24) | 70:30 |

EXAMPLE 51

To a reaction mixture obtained according to example 1a or 1b, containing 480 g of a mixture of the pigments of the formulae (1) and (2) in a mass ratio of 65:35, are added 72 g of C.I. Pigment Red 269 of the formula

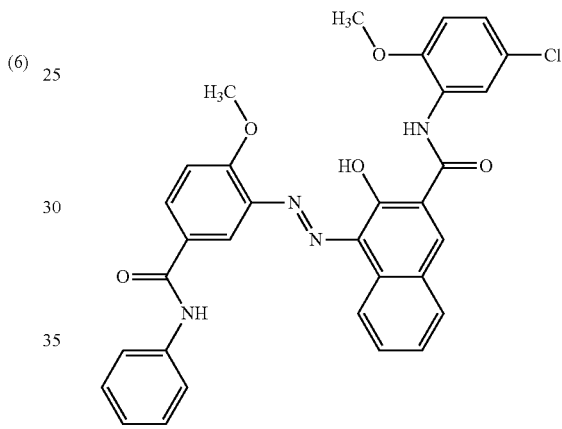
P.R. 269 and the mixture is homogenized by stirring at RT to 95° C. for a further 1 hour. After subsequent filtration, drying and grinding, 552 g of an inventive bluish-dark red pigment mixture are obtained.

EXAMPLE 52

To a reaction mixture obtained according to example 1a or 1b, containing 480 g of a mixture of the pigments of the formulae (1) and (2) in a mass ratio of 65:35, are added 96 g of C.I. Pigment Red 122 having the formula

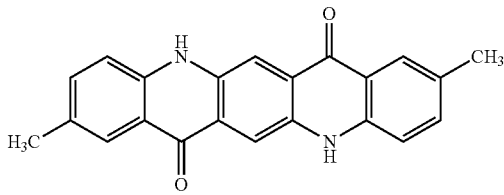
P.R. 122 and the mixture is homogenized by stirring at RT to 95° C. for a further 1 hour. After subsequent filtration, drying and grinding, 576 g of an inventive bluish-dark red pigment mixture are obtained.

EXAMPLE 53

50 g of a dry pigment of the formula (1), 30 g of a dry pigment of the formula (6) and 20 g of C.I. Pigment Red 122 are mixed in a mill and ground homogeneously. This gives 100 g of an inventive bluish-dark red pigment mixture.

Use Examples

The chroma and the hue angle were determined in an alkyd resin (0.5% strength).

In the resin system and test system mentioned, the chroma C of the pigment mixtures of the invention is preferably between 58 and 74 (74>C>58) and more preferably between 60 and 70 (70>C>60). In the case of a bluish magenta pigment, the hue h is preferably between 345 and 360 or between 0 and 15 and more preferably between 350 and 360 or between 0 and 10 (CIELAB coordinates).

a) Production of the 0.5% Alkyd Resin:

In a plastic cup, 0.45 g of a pigment mixture of the invention and 29.55 g of 31.8% grinding varnish (45.38% Vialkyd® AS 673 h/70% WS, 2.58% Octa®-Soligen 10% Ca, 2.82% STA soya lecithin concentrate and 49.22% 145/200 petroleum spirit) are weighed out and dispersed at 660 rpm with an agitating machine with addition of 85 g of glass beads having a diameter of 3 mm for 15 min.

Into this varnish are gradually weighed, in 5 portions of increasing size, a total of 60 g of siccatived letdown mixture, 54% strength (77.14% Vialkyd AS 673 h/70% WS, 0.9% Bykanol®-N, 19.16% 145/200 petroleum spirit and 2.8% Octa-Soligen 173 desiccant), and immediately mixed thoroughly each time. On completion of addition, the mixture is mixed homogeneously with the agitating machine for another 3 minutes and then the glass beads are sieved off.

b) Paint Test for Coloristic Properties:

The paint thus obtained is applied by means of a manual coater to a film applicator and applied in a wet film thickness of 100 µm to a test card (Chromo board, white, cast-coated on one side, 300 g/m², size 100×230 mm). The paint card is dried first at room temperature for 15 min and then in a drying cabinet at 60° C. for 60 min. The values for chroma (C) and hue (h) are measured by means of a D65 standard illuminant lamp at an observation angle of 10°, for example with a Datacolor—Spectraflash—SF600—PLUS CT spectrophotometer, according to DIN 5033-7, ISO 7724-2.

The test results of pigment mixtures of the invention are reported in table 4 below.

TABLE 4

| Use example | Pigment of formula (Ia) | Pigment of formula (Ib) | Mixing ratio | Chroma C | Hue angle h |
|---|---|---|---|---|---|
| 1 | (1) | (2) | 65:35 | 67.4 | 4.0 |
| 2 | (1) | (2) | 50:50 | 66.8 | 1.1 |
| 3 | (1) | (2) | 30:70 | 64.4 | 357.2 |
| 4 | (1) | (2) | 10:90 | 58.9 | 353.3 |
| 5 | (1) | (12) | 65:35 | 58.2 | 1.8 |

Use Examples for Color Filters

Use Example COF-1

15.0 g of the inventive pigment mixture according to example 1 are mixed by stirring in a paint shaker cup with 52.1 g of methoxypropyl acetate (PGMEA), 5.0 g of n-butanol and 16.0 g of Disperbyk® 2001 (BYK-Chemie, polymeric dispersing aid solution) and 11.9 g of Ripoxy® SPC-2000 (Showa Highpolymers Japan, 38% polymeric binder solution). After addition of 250 g of zirconia beads (0.3 mm), dispersion is effected in a Lau (Dispermat) dispersing unit for seven hours. The resultant millbase is separated from the beads by filtration. 20.0 g of the resultant millbase are mixed with 30.0 g of a 10% by weight solution of Ripoxy® SPC-2000 in PGMEA by agitating without beads for 10 minutes. Subsequently, the dispersion is filtered.

The resultant binder-containing pigment dispersion is applied with the aid of a spin-coater (POLOS Wafer Spinner) to glass plates (SCHOTT, laser-cut, 10×10 cm) in a layer thickness that enables setting of the color coordinates x specified in table 5 as reference values with use of a light source C.

The layer thickness in each case is about 1 to 2 micrometers.

The glass plates are left to flash off and then dried at 80° C. for 10 minutes in an air circulation drying cabinet (from Binder). The values for the color coordinates (x, y, Y, and CIELAB, Datacolor 650 spectrophotometer, illuminant C, 2° observer), transmission curves (ditto) and contrast values (Tsubosaka CT-1 contrast tester) of the glass plates were measured.

The contrast ratios ascertained and the x values measured for the glass plates of each sample are used to determine a line of best fit by calculation. This line describes the dependence of the contrast value on the color coordinate x. With the aid of the equation of the line, the contrast ratio at a defined x value is calculated and compared with the contrast ratio of the comparative sample at this x value.

Use Examples COF-2—COF-5

The procedure is as in use example COF-1, except that, rather than the pigment composition according to example 1, the inventive mixtures as specified in claim 5 are used.

Comparative Example: COF-V1

The millbase and color dispersion are produced analogously to the case of use example COF-1. However, what is used is not a pigment mixture of the invention, but rather a conventional magenta-colored quinacridone pigment for use in color filters (Hostaperm Red EG-COF, C.I. Pigment Red 209; Clariant Produkte Deutschland GmbH).

TABLE 5

| Use example | Pigment of formula (Ia) | Pigment of formula (Ib) | Mixing ratio | Relative contrast ratio CR (at fixed x = 0.500) |
|---|---|---|---|---|
| COF-1 | (1) | (2) | 65:35 | 135% |
| COF-2 | (1) | (2) | 50:50 | 123% |
| COF-3 | (1) | (2) | 30:70 | 117% |
| COF-4 | (1) | (2) | 10:90 | 122% |
| COF-5 | (1) | (12) | 65:35 | 113% |
| COF-C1 | Hostaperm Red EG-COF (C.I. Pigment Red 209) | | | 100% |

The relative contrast ratio CR relates to the color of the comparative example COF-C1 (100%) at a linear-extrapolated x value of x=0.500.

The value x relates to the color coordinates in the CIE-Yxy standard color space.

Result: The inventive examples each exhibit colors with good contrast value and high color intensity.

The invention claimed is:

1. An azo pigment mixture, comprising at least one azo pigment of the formula (IIIa) and at least one azo pigment of the formula (IIIb)

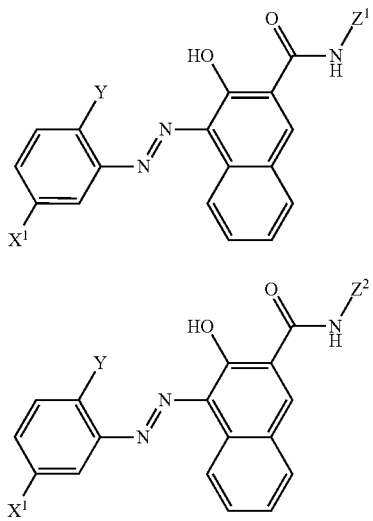

(IIIa)

(IIIb)

wherein, independently of one another, $X^1$ is carbamoyl, $C_1$-$C_2$-alkylcarbannoyl or di($C_1$-$C_2$)-alkylcarbamoyl;

Y is methyl, methoxy, ethyl or ethoxy;

$Z^1$ is phenyl or as phenyl substituted by one, two or three radicals from the group consisting of methyl, ethyl, methoxy, ethoxy and chlorine;

$Z^2$ is nitrophenyl or cyanophenyl, and the azo pigments of formula (IIIa) and formula (IIIb) are different.

2. The azo pigment mixture as claimed in claim 1, comprising 1% to 99% by weight of a component of the formula (IIIa) and 99% to 1% by weight of a component of the formula (IIIb), based on the total weight of the pigment mixture.

3. The azo pigment mixture as claimed in claim 1, comprising one or more additional colorants of the formula (IV) in proportions of up to 10% by weight, based on the total weight of the azo pigment mixture,

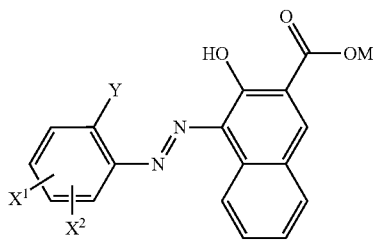

(IV)

wherein $X^1$ is carbamoyl, $C_1$-$C_4$-alkylcarbannoyl, di($C_1$-$C_4$)-alkylcarbamoyl, sulfamoyl, phenylsulfamoyl, $C_1$-$C_4$-alkylsulfannoyl or di($C_1$-$C_4$)-alkylsulfamoyl;

$X^2$ is hydrogen, $C_1$-$C_4$-alkyl, $C_1$-$C_4$-alkoxy, halogen or nitro;

Y is hydrogen, $C_1$-$C_4$-alkyl, $C_1$-$C_4$-alkoxy, halogen or $C_1$-$C_4$-alkoxycarbonyl; and M is hydrogen, an alkali metal, an alkaline earth metal or ammonium.

4. The azo pigment mixture as claimed in claim 1, comprising one or more additional colorants for shading from the group consisting of quinacridone pigments, naphthol AS pigments and combinations thereof, wherein the naphthol AS pigments are different than the azo pigments of the formula (IIIa) and (IIIb).

5. The azo pigment mixture as claimed in claim 1, comprising at least the azo pigments of formulae (IIIa) and (IIIb), wherein $X^1$ is carbamoyl, methylcarbamoyl or ethylcarbamoyl;

Y is methoxy or ethoxy;

$Z^1$ is nnethylphenyl, ethylphenyl, methoxyphenyl or ethoxyphenyl; and $Z^2$ is nitrophenyl or cyanophenyl.

6. The azo pigment mixture as claimed in claim 5, comprising at least the azo pigments of formulae (IIIa) and (IIIb), wherein $X^1$ is carbamoyl or methylcarbamoyl;

Y is methoxy;

$Z^1$ is methylphenyl; and $Z^2$ is nitrophenyl.

7. The azo pigment mixture as claimed in claim 6, comprising at least the azo pigments of formulae (IIIa) and (IIIb), wherein $Z^1$ is o-methylphenyl; and $Z^2$ is m-nitrophenyl.

* * * * *